United States Patent [19]
Buch

[11] Patent Number: 5,764,165
[45] Date of Patent: Jun. 9, 1998

[54] ROTATED COUNTER BIT PULSE WIDTH MODULATED DIGITAL TO ANALOG CONVERTER

[75] Inventor: Bruce D. Buch, Westboro, Mass.

[73] Assignee: Quantum Corporation, Milpitas, Calif.

[21] Appl. No.: 642,754

[22] Filed: May 3, 1996

[51] Int. Cl.$^6$ .................................................. H03M 5/08
[52] U.S. Cl. ............................................ 341/53; 341/152
[58] Field of Search .................................... 341/53, 152

[56] References Cited

U.S. PATENT DOCUMENTS

| | | | |
|---|---|---|---|
| 3,603,977 | 9/1971 | Szabo | 340/347 |
| 3,632,876 | 1/1972 | Bench | 178/68 |
| 3,836,908 | 9/1974 | Hegendorfer | 340/347 |
| 3,993,954 | 11/1976 | Sugai | 325/43 |
| 4,032,915 | 6/1977 | Shanks et al. | 340/347 |
| 4,061,975 | 12/1977 | Sugai | 325/322 |
| 4,061,976 | 12/1977 | Sugai | 325/322 |
| 4,065,765 | 12/1977 | Wagner | 340/347 |
| 5,255,136 | 10/1993 | Machado et al. | 360/77.02 |
| 5,481,560 | 1/1996 | Potetz et al. | 375/238 |

OTHER PUBLICATIONS

AN538, "Using PWM to Generate Analog Output in PIC17C42", *Embedded Control Handbook*, ©1992, Microchip Technology, Inc., pp. 3-13 to 3-14.

AN539, "Frequency and Resolution Options for PWM Outputs in the PIC17C42", *Embedded Control Handbook*, ©1992, Microchip Technology, Inc., pp. 3-3 to 3-12.

*Primary Examiner*—Jeffrey A. Gaffin
*Assistant Examiner*—Jason H. Vick
*Attorney, Agent, or Firm*—David B. Harrison; Debra A. Chun

[57] ABSTRACT

A pulse width modulated, digital-to-analog converter (PWM DAC) that includes a pulse generator for generating width modulated pulses in accordance with a digital control value is set forth. The generator includes a clock for generating a clocking signal, a counter responsive to the clocking signal for generating repeating sequences of N-bit counts, each sequence representing a count interval. The PWM DAC further includes a bit rotator for receiving the sequences of N-bit counts and for rotating the bit position of at least a most significant one of N-bits. A latch holds a digital control value, whereby a comparator compares the digital control value with each one of the rotated bit counts to put out the width modulated pulses during the count interval. The rotated bit counts increases the frequency of the comparator, in a substantially linear manner, such that subsequent filtering can be accomplished with minimum time requirements.

8 Claims, 11 Drawing Sheets

| Input | PWM output for counter values from 0 to 63 | #of 1's | #of 0's | # of pulses |
|---|---|---|---|---|
| | 0                                                             63 | | | |
| -32 | 0000000000000000000000000000000000000000000000000000000000000000 | 0 | 64 | 0 |
| -31 | 1000000000000000000000000000000000000000000000000000000000000000 | 1 | 63 | 1 |
| -30 | 1100000000000000000000000000000000000000000000000000000000000000 | 2 | 62 | 1 |
| -29 | 1110000000000000000000000000000000000000000000000000000000000000 | 3 | 61 | 1 |
| -28 | 1111000000000000000000000000000000000000000000000000000000000000 | 4 | 60 | 1 |
| -27 | 1111100000000000000000000000000000000000000000000000000000000000 | 5 | 59 | 1 |
| -26 | 1111110000000000000000000000000000000000000000000000000000000000 | 6 | 58 | 1 |
| -25 | 1111111000000000000000000000000000000000000000000000000000000000 | 7 | 57 | 1 |
| -24 | 1111111100000000000000000000000000000000000000000000000000000000 | 8 | 56 | 1 |
| -23 | 1111111110000000000000000000000000000000000000000000000000000000 | 9 | 55 | 1 |
| -22 | 1111111111000000000000000000000000000000000000000000000000000000 | 10 | 54 | 1 |
| -21 | 1111111111100000000000000000000000000000000000000000000000000000 | 11 | 53 | 1 |
| -20 | 1111111111110000000000000000000000000000000000000000000000000000 | 12 | 52 | 1 |
| -19 | 1111111111111000000000000000000000000000000000000000000000000000 | 13 | 51 | 1 |
| -18 | 1111111111111100000000000000000000000000000000000000000000000000 | 14 | 50 | 1 |
| -17 | 1111111111111110000000000000000000000000000000000000000000000000 | 15 | 49 | 1 |
| -16 | 1111111111111111000000000000000000000000000000000000000000000000 | 16 | 48 | 1 |
| -15 | 1111111111111111100000000000000000000000000000000000000000000000 | 17 | 47 | 1 |
| -14 | 1111111111111111110000000000000000000000000000000000000000000000 | 18 | 46 | 1 |
| -13 | 1111111111111111111000000000000000000000000000000000000000000000 | 19 | 45 | 1 |
| -12 | 1111111111111111111100000000000000000000000000000000000000000000 | 20 | 44 | 1 |
| -11 | 1111111111111111111110000000000000000000000000000000000000000000 | 21 | 43 | 1 |
| -10 | 1111111111111111111111000000000000000000000000000000000000000000 | 22 | 42 | 1 |
| -9 | 1111111111111111111111100000000000000000000000000000000000000000 | 23 | 41 | 1 |
| -8 | 1111111111111111111111110000000000000000000000000000000000000000 | 24 | 40 | 1 |
| -7 | 1111111111111111111111111000000000000000000000000000000000000000 | 25 | 39 | 1 |
| -6 | 1111111111111111111111111100000000000000000000000000000000000000 | 26 | 38 | 1 |
| -5 | 1111111111111111111111111110000000000000000000000000000000000000 | 27 | 37 | 1 |
| -4 | 1111111111111111111111111111000000000000000000000000000000000000 | 28 | 36 | 1 |
| -3 | 1111111111111111111111111111100000000000000000000000000000000000 | 29 | 35 | 1 |
| -2 | 1111111111111111111111111111110000000000000000000000000000000000 | 30 | 34 | 1 |

```
Thresh ---------- PWM output for counter values from 0 to 63 ---------   #of  #of   # of
                                                                          1's  0's  pulses
         0                                                         63
  0:  0000000000000000000000000000000000000000000000000000000000000000    0    64   0
 -1:  1000000000000000000000000000000000000000000000000000000000000000    1    63   1
 -2:  1000000000000000000000000000000010000000000000000000000000000000    2    62   2
 -3:  1100000000000000000000000000000010000000000000000000000000000000    3    61   2
 -4:  1100000000000000000000000000000011000000000000000000000000000000    4    60   2
 -5:  1110000000000000000000000000000011000000000000000000000000000000    5    59   2
 -6:  1110000000000000000000000000000011100000000000000000000000000000    6    58   2
 -7:  1111000000000000000000000000000011100000000000000000000000000000    7    57   2
 -8:  1111000000000000000000000000000011110000000000000000000000000000    8    56   2
 -9:  1111100000000000000000000000000011110000000000000000000000000000    9    55   2
-10:  1111100000000000000000000000000011111000000000000000000000000000   10    54   2
-11:  1111110000000000000000000000000011111000000000000000000000000000   11    53   2
-12:  1111110000000000000000000000000011111100000000000000000000000000   12    52   2
-13:  1111111000000000000000000000000011111100000000000000000000000000   13    51   2
-14:  1111111000000000000000000000000011111110000000000000000000000000   14    50   2
-15:  1111111100000000000000000000000011111110000000000000000000000000   15    49   2
-16:  1111111100000000000000000000000011111111000000000000000000000000   16    48   2
-17:  1111111110000000000000000000000011111111000000000000000000000000   17    47   2
-18:  1111111110000000000000000000000011111111100000000000000000000000   18    46   2
-19:  1111111111000000000000000000000011111111100000000000000000000000   19    45   2
-20:  1111111111000000000000000000000011111111110000000000000000000000   20    44   2
-21:  1111111111100000000000000000000011111111110000000000000000000000   21    43   2
-22:  1111111111100000000000000000000011111111111000000000000000000000   22    42   2
-23:  1111111111110000000000000000000011111111111000000000000000000000   23    41   2
-24:  1111111111110000000000000000000011111111111100000000000000000000   24    40   2
-25:  1111111111111000000000000000000011111111111100000000000000000000   25    39   2
-26:  1111111111111000000000000000000011111111111110000000000000000000   26    38   2
-27:  1111111111111100000000000000000011111111111110000000000000000000   27    37   2
-28:  1111111111111100000000000000000011111111111111000000000000000000   28    36   2
-29:  1111111111111110000000000000000011111111111111000000000000000000   29    35   2
-30:  1111111111111110000000000000000011111111111111100000000000000000   30    34   2
```

Thresh —————— PWM output for counter values from 0 to 63 —————— #of 1's | #of 0's | # of pulses

| Thresh | PWM output (bits 0–63) | #of 1's | #of 0's | # of pulses |
|---|---|---|---|---|
| -32 | 0000000000000000000000000000000000000000000000000000000000000000 | 0 | 64 | 0 |
| -31 | 1000000000000000000000000000000000000000000000000000000000000000 | 1 | 63 | 1 |
| -30 | 1000000000000000000000000000000010000000000000000000000000000000 | 2 | 62 | 2 |
| -29 | 1000000000000000000001000000000000000000000100000000000000000000 | 3 | 61 | 3 |
| -28 | 1000000000000000100000000000000010000000000000001000000000000000 | 4 | 60 | 4 |
| -27 | 1000000000000100000000000010000000000001000000000000100000000000 | 5 | 59 | 4 |
| -26 | 1000000000100000000001000000000100000000010000000001000000000100 | 6 | 58 | 4 |
| -25 | 1000000010000000100000001000000010000000100000001000000010000000 | 7 | 57 | 4 |
| -24 | 1000000100000010000000100000010000000100000010000001000000100000 | 8 | 56 | 4 |
| -23 | 1000001000001000001000001000001000001000010000010000010000010000 | 9 | 55 | 4 |
| -22 | 1000010000100001000010000100001000010000100001000010000100001000 | 10 | 54 | 4 |
| -21 | 1000100001000100001000100001000100010001000100010001000100010001 | 11 | 53 | 4 |
| -20 | 1000100010001000100100010001000100100010001000100010010001000100 | 12 | 52 | 4 |
| -19 | 1001000100100010010001001000100100010010001001000100100010010001 | 13 | 51 | 4 |
| -18 | 1001001001001001001001001001001001001001001001001001001001001001 | 14 | 50 | 4 |
| -17 | 1001001010010010010100100100101001001001010010010010100100100101 | 15 | 49 | 4 |
| -16 | 1001010010100101001010010100101001010010100101001010010100101001 | 16 | 48 | 4 |
| -15 | 1010010100101010010100101001010101001010010101001010010101001010 | 17 | 47 | 4 |
| -14 | 1010010101001010101001010100101010100101010010101010010101001010 | 18 | 46 | 4 |
| -13 | 1010101001010101010100101010101010010101010101001010101010100101 | 19 | 45 | 4 |
| -12 | 1010101010101010101010101010101010101010101010101010101010101010 | 20 | 44 | 4 |
| -11 | 1010101010101010110101010101010101011010101010101010101101010101 | 21 | 43 | 4 |
| -10 | 1010101011010101010110101010101101010101011010101010110101010101 | 22 | 42 | 4 |
| -9 | 1010110101011010101101010110101011010101101010110101011010101101 | 23 | 41 | 4 |
| -8 | 1011010110101101011010110101101011010110101101011010110101101011 | 24 | 40 | 4 |
| -7 | 1011010110110101101101011011010110110101101101011011010110110101 | 25 | 39 | 4 |
| -6 | 1011011011011011011011011011011011011011011011011011011011011011 | 26 | 38 | 4 |
| -5 | 1011011101101110110111011011101101110110111011011101101110110111 | 27 | 37 | 4 |
| -4 | 1011101110111011101110111011101110111011101110111011101110111011 | 28 | 36 | 4 |
| -3 | 1110111011101110111011101110111011101110111011101110111011101110 | 29 | 35 | 4 |
| -2 | 1111011110111101111011110111101111011110111101111011110111101111 | 30 | 34 | 4 |

Thresh ———— PWM output for counter values from 0 to 63 ———— #of 1's | #of 0's | # of pulses

| Thresh | PWM output (bits 0 to 63) | #of 1's | #of 0's | # of pulses |
|---|---|---|---|---|
| -32 | 0000000000000000000000000000000000000000000000000000000000000000 | 0 | 64 | 0 |
| -31 | 1000000000000000000000000000000000000000000000000000000000000000 | 1 | 63 | 1 |
| -30 | 1000000000000000000000000000000010000000000000000000000000000000 | 2 | 62 | 2 |
| -29 | 1000000000000000000000100000000010000000000000000000000000000000 | 3 | 61 | 3 |
| -28 | 1000000000000000000000100000000010000000000000000001000000000000 | 4 | 60 | 4 |
| -27 | 1000000000010000000000100000000010000000000000000001000000000000 | 5 | 59 | 5 |
| -26 | 1000000000010000000000100000000010000000001000000001000000000000 | 6 | 58 | 6 |
| -25 | 1000000001010000000000100000000010000000001000000001000000000000 | 7 | 57 | 7 |
| -24 | 1000000001010000000000100000000010000000001000000001000000001000 | 8 | 56 | 8 |
| -23 | 1000000001010000000100100000000010000000001000000001000000001000 | 9 | 55 | 8 |
| -22 | 1100000001010000000100100000000010000000001000000001000000001000 | 10 | 54 | 8 |
| -21 | 1100000001010000000100100000000011000000001000000001000000001000 | 11 | 53 | 8 |
| -20 | 1100000001010000000100110000000011000000001000000001000000001000 | 12 | 52 | 8 |
| -19 | 1100000001010000000100110000000011000000001000000001000100001000 | 13 | 51 | 8 |
| -18 | 1100000001010000000100110000000011000000001000010001000100001000 | 14 | 50 | 8 |
| -17 | 1100000001110000000100110000000011000000001000010001000100001000 | 15 | 49 | 8 |
| -16 | 1100000001110000000100110000000011000000001100010001000100001000 | 16 | 48 | 8 |
| -15 | 1110000001110000000100110000000011000000001100010001000100001000 | 17 | 47 | 8 |
| -14 | 1110000001110000000100110000000011000000001100010001000100011000 | 18 | 46 | 8 |
| -13 | 1110000001110000000100110000000011000000001100011001000100011000 | 19 | 45 | 8 |
| -12 | 1110000001110000000110110000000011000000001100011001000100011000 | 20 | 44 | 8 |
| -11 | 1110000001110000000110110000000011100000001100011001000100011000 | 21 | 43 | 8 |
| -10 | 1110000001110000000110110000000011100000001100011001000110011000 | 22 | 42 | 8 |
| -9 | 1110000001110000000110110000000011100000001100011001100110011000 | 23 | 41 | 8 |
| -8 | 1110000001110000000110110000000011100000011100011001100110011000 | 24 | 40 | 8 |
| -7 | 1110000001110000000110111000000011100000011100011001100110011000 | 25 | 39 | 8 |
| -6 | 1110000001110000000110111000000011100000011100011001100110011100 | 26 | 38 | 8 |
| -5 | 1110000001110000000111111000000011100000011100011001100110011100 | 27 | 37 | 8 |
| -4 | 1110000001110000000111111000000011100000011100011101100110011100 | 28 | 36 | 8 |
| -3 | 1110000001110000000111111000000011110000011100011101100110011100 | 29 | 35 | 8 |
| -2 | 1110000001111000000111111000000011110000011100011101100110011100 | 30 | 34 | 8 |

ROTATED COUNTER BIT PULSE WIDTH MODULATED DIGITAL TO ANALOG CONVERTER

FIELD OF THE INVENTION

This invention relates to digital-to-analog converters. More particularly, the present invention relates to a digital-to-analog converter employing rotated-bit pulse width modulation in generating an analog value from a digital value.

BACKGROUND OF THE INVENTION

The function of a digital-to-analog converter (DAC) is to convert a digital binary number into an analog current or voltage. DACs enjoy widespread use in a wide variety of applications. DACs have several known limitations. One limitation is the rate of change ("slew rate") and amount of settling time required for the output analog signal to change from one value to a new value in response to a new digital command value. Another limitation of a DAC is linearity and repeatability of its transfer curve. All DACs are output slew-rate limited and have dynamics which are difficult to model. While slew rate and settling time are effects of relatively short duration, in some applications, non-linearities and time delays may prove critical. One such application is to convert digital control values very rapidly into analog control currents for controlling movements of voice coil head positioner actuators in high performance disk drives.

DACs may be implemented following a variety of architectures. One DAC architecture employs a switched precision resistance ladder. Another approach employs pulse width modulation (PWM) followed by low pass filtering. This other approach is frequently favored for inclusion with other digital circuitry in very large scale, application specific integrated circuit chips. The present invention relates to the PWM DAC technique and to its implementing structure.

Conventional PWM DACs frequently employ a latch, a free-running rollover counter and a digital comparator in order to generate a two-level PWM waveform. Each incremental count reached by the rollover counter is compared with a command value held in the latch. When a maximum count value is reached, the counter rolls over to zero or a preset count value and resumes incremental counting. If an incremental count value is greater than the command value, the comparator output is true, otherwise it is false. Thus, the comparator puts out a pulse having a duty cycle or width which varies in accordance with the digital command value held in the latch. An analog low pass filter following the comparator is required to convert the two-level waveform into an analog signal proportional to the pulse width, thereby completing the conversion from digital domain to analog domain.

One drawback of the PWM conversion approach is that relatively substantial low pass filtering is required to reduce output ripple of the conventional two-level waveform generated within a single count interval. The substantial low pass filtering has an undesirable effect of slowing the rate of change of the filtered analog signal (increased settling time), and therefore imposes a speed limitation upon analog signal level changes (slewing rate) in the output of the PWM-based DAC.

In the example of the conventional PWM DAC given above one pulse of controlled width is generated at the output of the comparator for each rollover count cycle of the rollover counter. The low pass filter, typically implemented with resistance and capacitance elements, will typically require a relatively large capacitor to provide adequate smoothing to the relatively low frequency pulse in order to minimize ripple. The time constant of the low pass filter is therefore relatively long, imposing an undesirable limitation upon DAC slewing rate and settling time. If a smaller value capacitor were used, output filtering would be incomplete, and the output analog signal would undesirably include pulse transients and ripple components.

Thus, a hitherto unsolved need has remained for a PWM DAC which achieves a smooth analog output at a relatively fast slewing rate.

SUMMARY OF THE INVENTION WITH OBJECTS

A general object of the present invention is to provide an improved, simplified digital pulse generator and method for generating width modulated pulses in a manner overcoming limitations and drawbacks of prior approaches.

Another object of the present invention is to employ a bit rotation in order to increase pulse frequency within a count interval of a PWM DAC without increasing clocking rate, or digital circuit complexity.

One more object of the present invention is to provide a rotated bit PWM generator within a DAC in which the degree of bit rotation is electrically programmable in real time.

In accordance with principles of the present invention, a PWM DAC includes a digital to analog pulse generator for generating width modulated pulses in accordance with a digital control value. The generator includes a clock for generating a clocking signal, a counter responsive to the clocking signal for generating repeating sequences of N-bit counts, each sequence representing a count interval, a bit rotator for receiving the sequences of N-bit counts and for rotating bit position of at least a most significant one of N-bits, a latch for holding the digital control value, and a comparator for comparing the digital control value with each one of the rotated N-bit counts to put out the width modulated pulses during the count interval in accordance with the relation $P=2^N$, where $2^N$ is the number of clock cycles in the count interval. The number of pulse-width-modulated pulses output during a count interval is $2^R$ where R is the number of bit positions which are rotated.

The bit rotator may comprise a fixed pattern of rotated bit positions; or more preferably include N multiplexers, each having R inputs, where R equals the number of bit rotation options provided. In this preferred arrangement the multiplexers are controlled by a common bit rotation control value applied over a common control bus.

In a related aspect of the invention, a method for generating width modulated pulses in accordance with a digital control value comprises the steps of:

generating a clocking signal, generating repeating sequences of N-bit counts by repeatedly counting a sequence marked by the clocking signal, each sequence representing a count interval, rotating bit position of at least a most significant one of N-bits, latching the digital control value, and comparing the digital control value with each one of the rotated N-bit counts to generate the width modulated pulses during the count interval in accordance with the relation $P=2^N$, where $2^N$ is the number of clock cycles in the count interval. The number of pulse-width-modulated pulses output during a count interval is $2^R$ where R is the number of bit positions which are rotated.

These and other objects, advantages, aspects and features of the present invention will be more fully understood and appreciated by those skilled in the art upon consideration of the following detailed description of a preferred embodiment, presented in conjunction with the accompanying drawings.

DETAILED DESCRIPTION OF A PREFERRED EMBODIMENT

Figure 1:
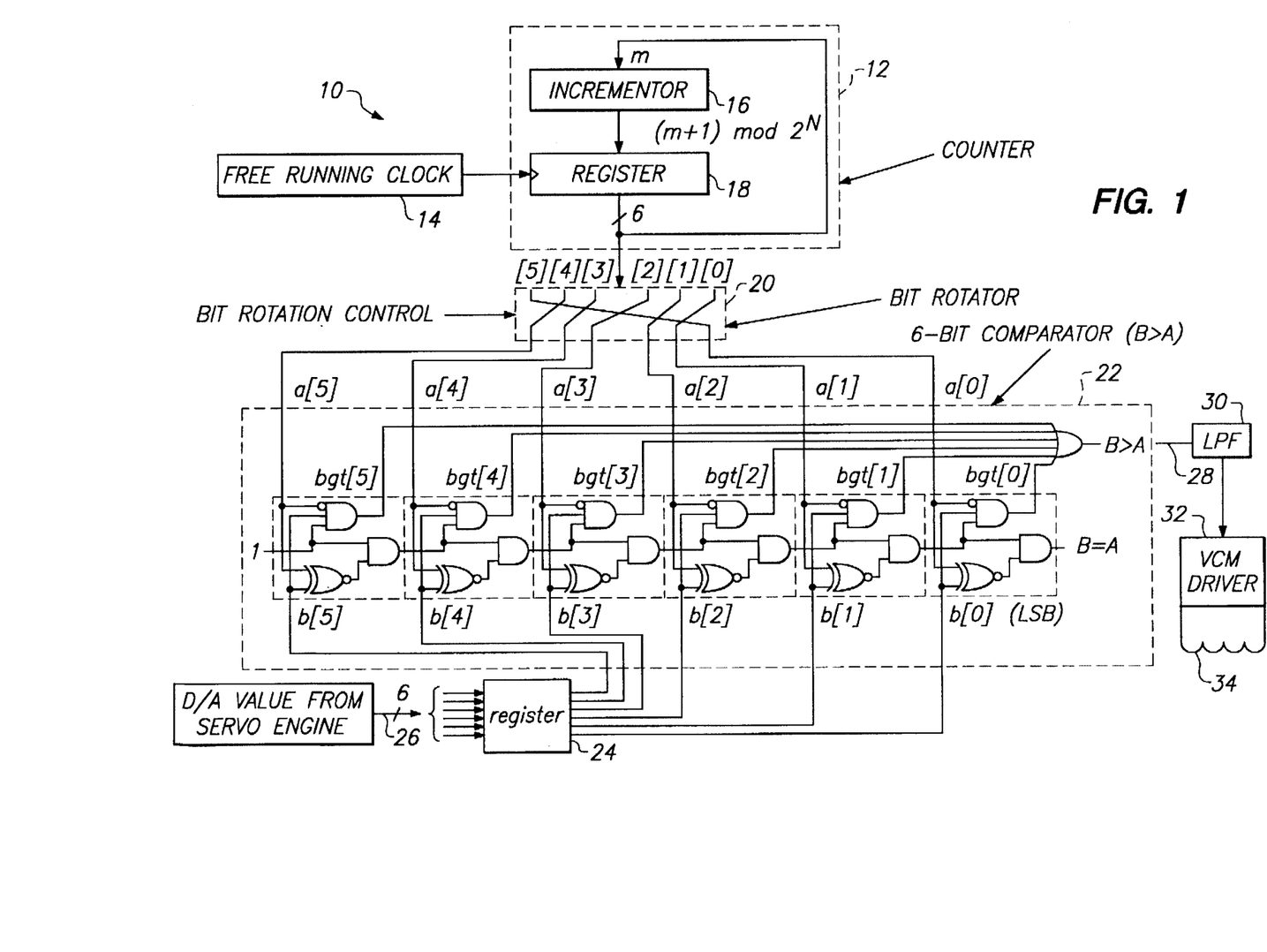
FIG. 1 is a block diagram of a PWM DAC incorporating bit-rotation principles of the present invention.

A DAC 10 incorporating principles of the present invention is shown in FIG. 1. The DAC 10 includes a rollover counter 12 clocked by a free running clock 14 at a predetermined high clocking frequency. The rollover counter 12 includes an incrementor 16 and a register 18 for cooperatively generating a progressively incrementing sequence of six-bit binary values during each count cycle. Each count cycle ends when a maximum or overflow count is reached, and the counter resets to zero count and begins counting up again in the next count cycle.

The DAC 10 also includes a bit rotator 20 implementing aspects of the present invention. The bit rotator 20 rotates the bit order of one or more of the six bits of each count value coming out of the counter 12, and passes the rotated bit values to a six stage, six bit comparator 22. The comparator 22 also receives six bit control values from a register 24. The register 24 holds the control values received from a bus 26. In the present example, the bus 26 extends from a servo controller which generates the six bit digital control values for controlling a voice coil motor within a head positioner servo loop of a disk drive.

The six stage comparator 22 receives the bit-rotated count value on a first input path (a[5-0] bus) and the latched control value on a second input path (b[5-0] bus). The comparator 22 compares each rotated-bit value on the first path with the latched control value on the second path. For so long as the latched control value is larger than each rotated-bit count value compared by the comparator 22, a logical true value is put out as a PWM pulse over a path 28 to a low pass filter 30 which filters the PWM pulse into an analog signal. The analog signal is then passed through a voice coil motor driver amplifier 32 and applied to a voice coil 34 of the voice coil motor in order to reposition a data transducer head relative to a rotating disk within the disk drive.

The register 18 within counter 12 shown in FIG. 1 stores an N-bit value (N=6 in the present example). The register 18 is a clocked storage element that stores the N-bit value at its input pins upon assertion of the clock signal from the free running clock 14. This stored value is driven to the output of the register 18 until a new value is stored at the next clock pulse. The incrementor 16 is preferably combinatorial logic having an input connected to the output of the register 18. The incrementor 16 generates a value m+1 from a value m at the output of the register 18.

When the input is the maximum value that can be expressed as an N-bit number (e.g. 111111 for N=6), the incrementor's output is zero. More precisely, the output of the incrementor 16 is $(m+1) \bmod 2^N$, where m is the input and N is the bit width of the incrementor. Accordingly, the clocked register 18 and the incrementor 16 implement the counter 12 which outputs a sequence of numbers, each number being incremented by one upon assertion of each clock, and rolling over to zero when the number reaches all ones.

The bit rotator 20 may implement a fixed bit rotation strategy, or a variable bit number rotation strategy. A fixed bit rotation strategy is suggested by FIG. 1, while a programmable bit number rotation strategy may be realized by the FIG. 2 circuit. For an implementation using a fixed amount of rotation (e.g. 1 bit) the rotator 20 is nothing more than a static rearrangement of the connection paths between the counter 12 and the comparator 22, as shown in FIG. 1 for the case of a one-bit rotation of a six-bit count value. In the FIG. 1 example, the high order bit (bit[5]) from the counter 12 is rotated to become the low order comparator bit (bit a[0]), and the other five bits connecting to the comparator 22 are respectively rotated one bit position toward the high order bit position.

Figure 2:
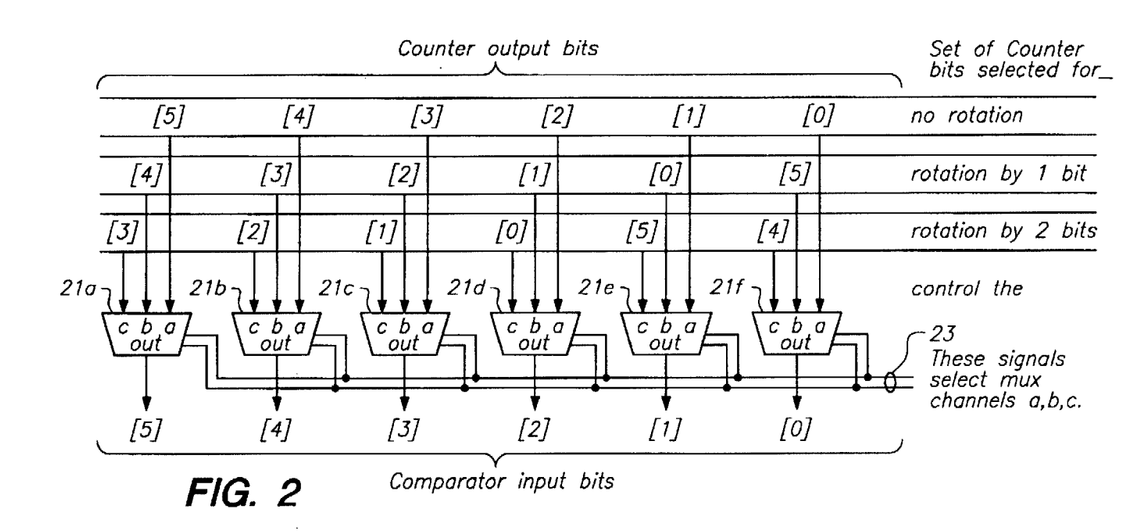
FIG. 2 is a block diagram of a programmable bit rotator for inclusion within the FIG. 1 DAC.

An electronically-selectable bit rotator 20' is illustrated in FIG. 2. Multiplexers 21 which total N in number may selectively provide up to N−1 bit rotation programmable options. In the FIG. 2 example, six three-input multiplexers 21a, 21b, 21c, 21d, 21e, and 21f have inputs which are connected to illustrated bit positions of the counter 12, in order to select between available bit rotation options. The multiplexers 21a-f are controlled via a common digital control path 23, which may be controlled by a disk drive controller writing a rotation value to a control latch (not shown). The rotation value will then be applied over the control bus 23 to select the bit rotation degree. When the a[N] inputs of the multiplexers 21a-f are selected, no bit rotation occurs, and the DAC 10 operates conventionally. When the b[N] inputs are selected, a one-bit rotation is applied. When the c[N] inputs are selected, a two-bit rotation is applied, etc.

Figure 3:
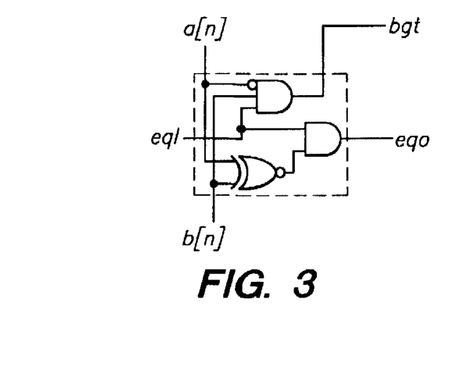
FIG. 3 is a block diagram of one single bit ripple comparator element within the FIG. 1 comparator.
Figure 4:
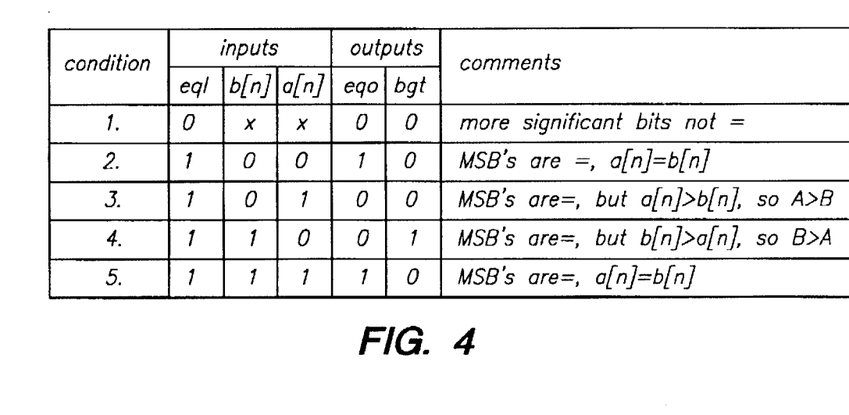
FIG. 4 is a truth table for the FIG. 3 comparator element.

The comparator 22 comprises a series of simple ripple comparators connected in tandem as shown in FIG. 1. FIG. 3 shows a comparator element 22n formed of combinatorial logic, and FIG. 4 sets forth a truth table applicable to the logic comprising the exemplary single bit comparator element 22n. As configured in FIG. 1, the comparator 22 puts out one or more pulses of variable duty cycle for each count cycle of the counter.

Figure 5:
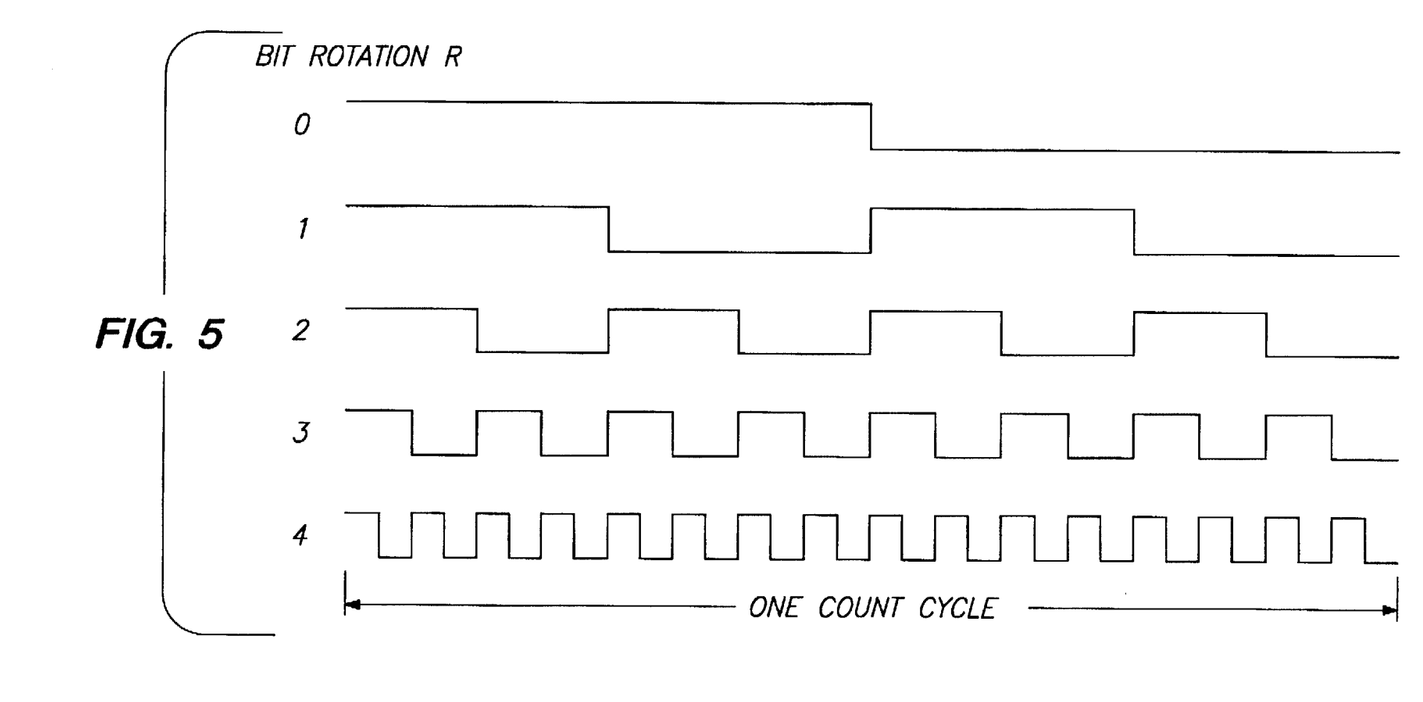
FIG. 5 is a series of graphs relating bit rotation to pulse width number and duty cycle for pulses put out by the FIG. 1 PWM DAC in response to a half-duty cycle control command value during a single count cycle.

FIG. 5 sets forth pulse generation examples for bit rotations of 0-5. As can be appreciated by inspection of FIG. 5, the number of pulses (P) emitted by the comparator 22 for each counter cycle is consistent with an expression $P=2^R$ where P is the number of pulses generated at the output 28, and R is the bit rotation number imposed by the bit rotator 20. Bit rotations for R=0, R=1, R=2, R=3, R=4 and R=5 are shown in FIG. 5. If, for example, the counter 12 counts from 0-63, and the control value held in the register 24 is 32 (50% duty cycle command), without bit rotation, the output pulse (0) has a single, 32 count interval. With a bit rotation of 1, the output pulse sequence (1) per count cycle is two equally spaced apart pulses, each having a duration of 16 counts. With a bit rotation of 2, the output pulse sequence (2) is four equally spaced apart pulses, each having a duration of 8 counts. With a bit rotation of 3, the output pulse sequence (3) is eight equally spaced apart pulses, each having a duration of 4 counts. With a bit rotation of 4, the output pulse sequence (4) is sixteen equally spaced apart pulses, each having a duration of 2 counts.

Figure 6A:
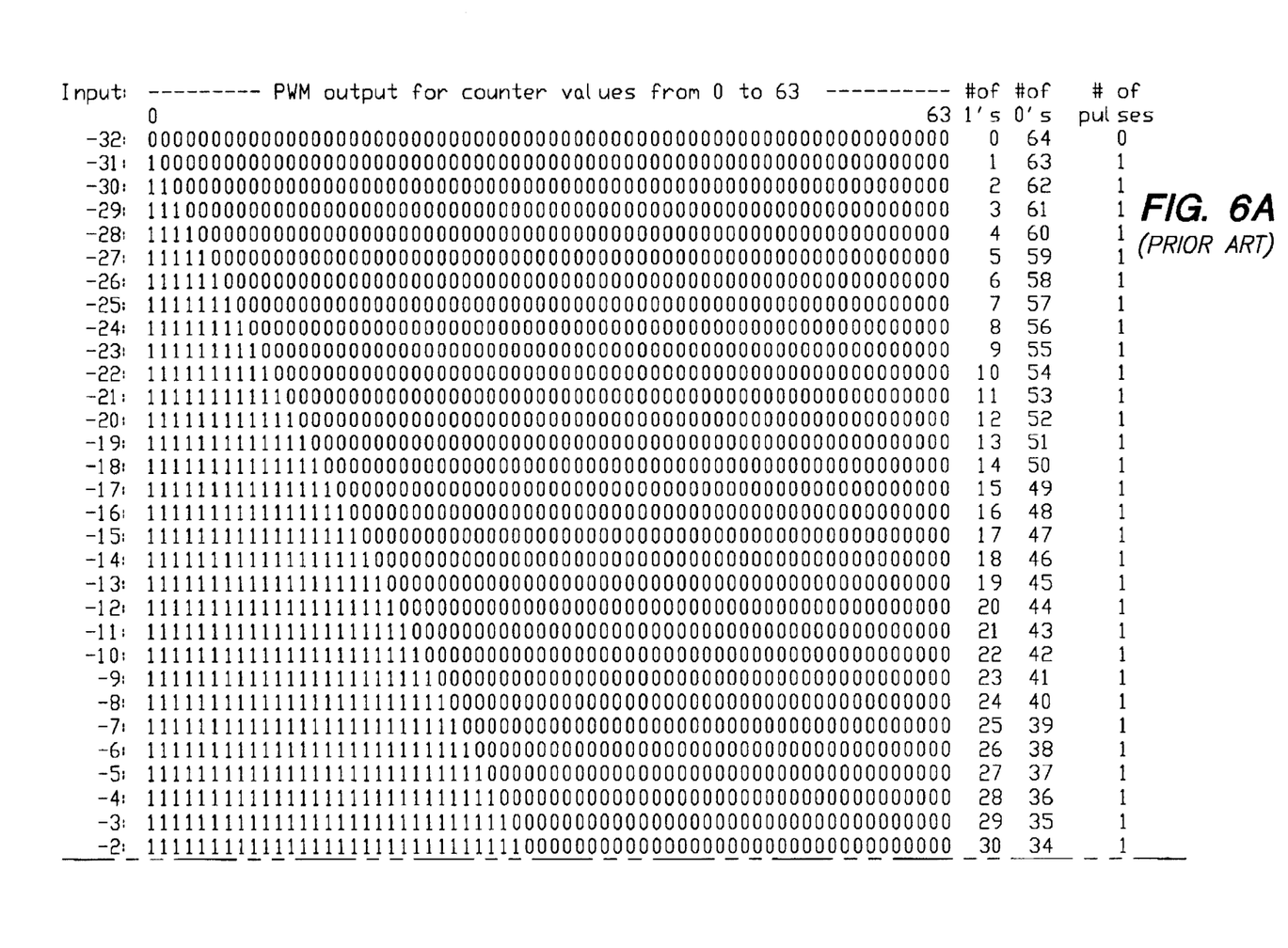
FIG. 6 represents an output spectrum from the comparator of the FIG. 1 circuit resulting from zero-bit rotation.
Figure 6B:
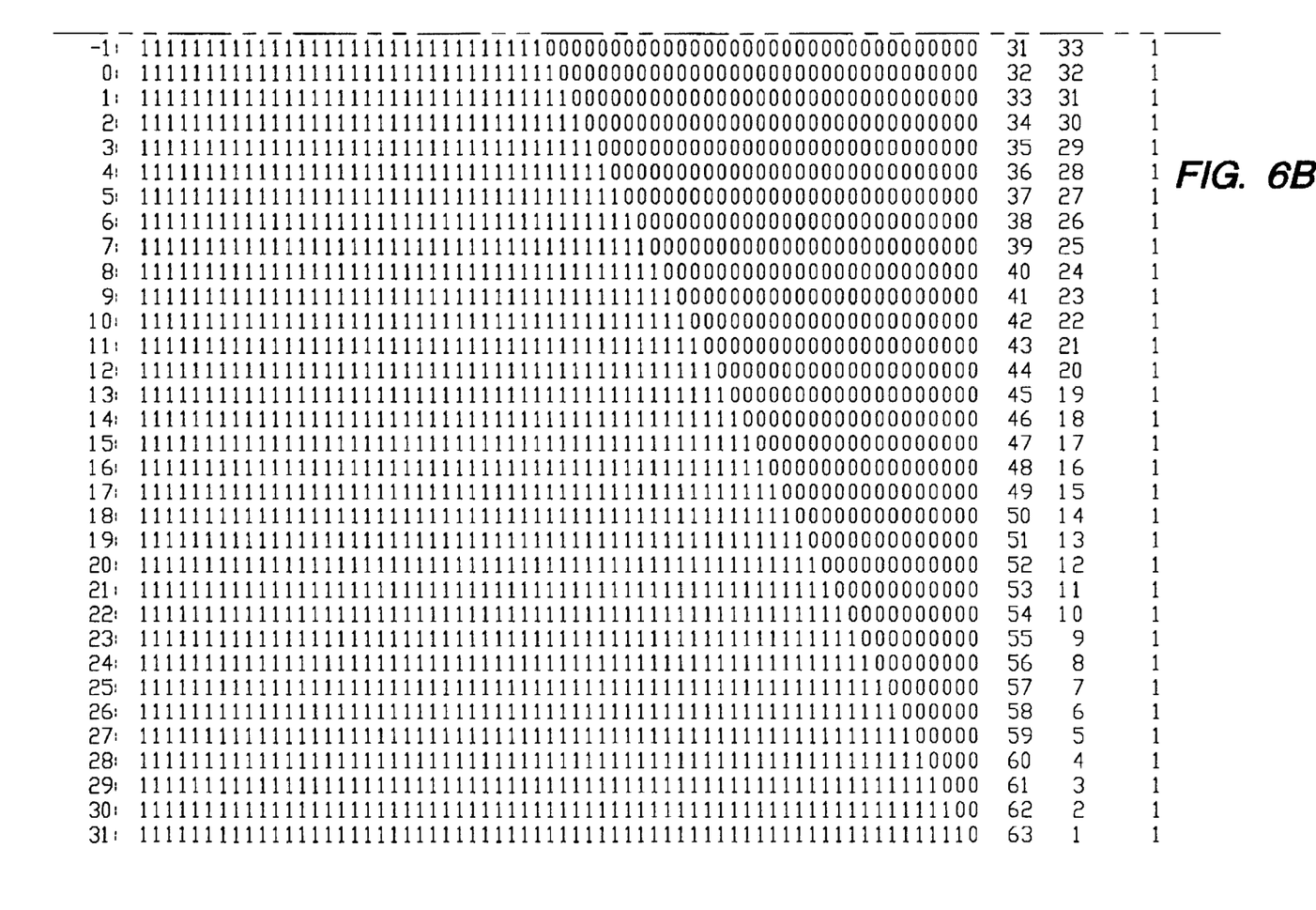
Figure 7A:
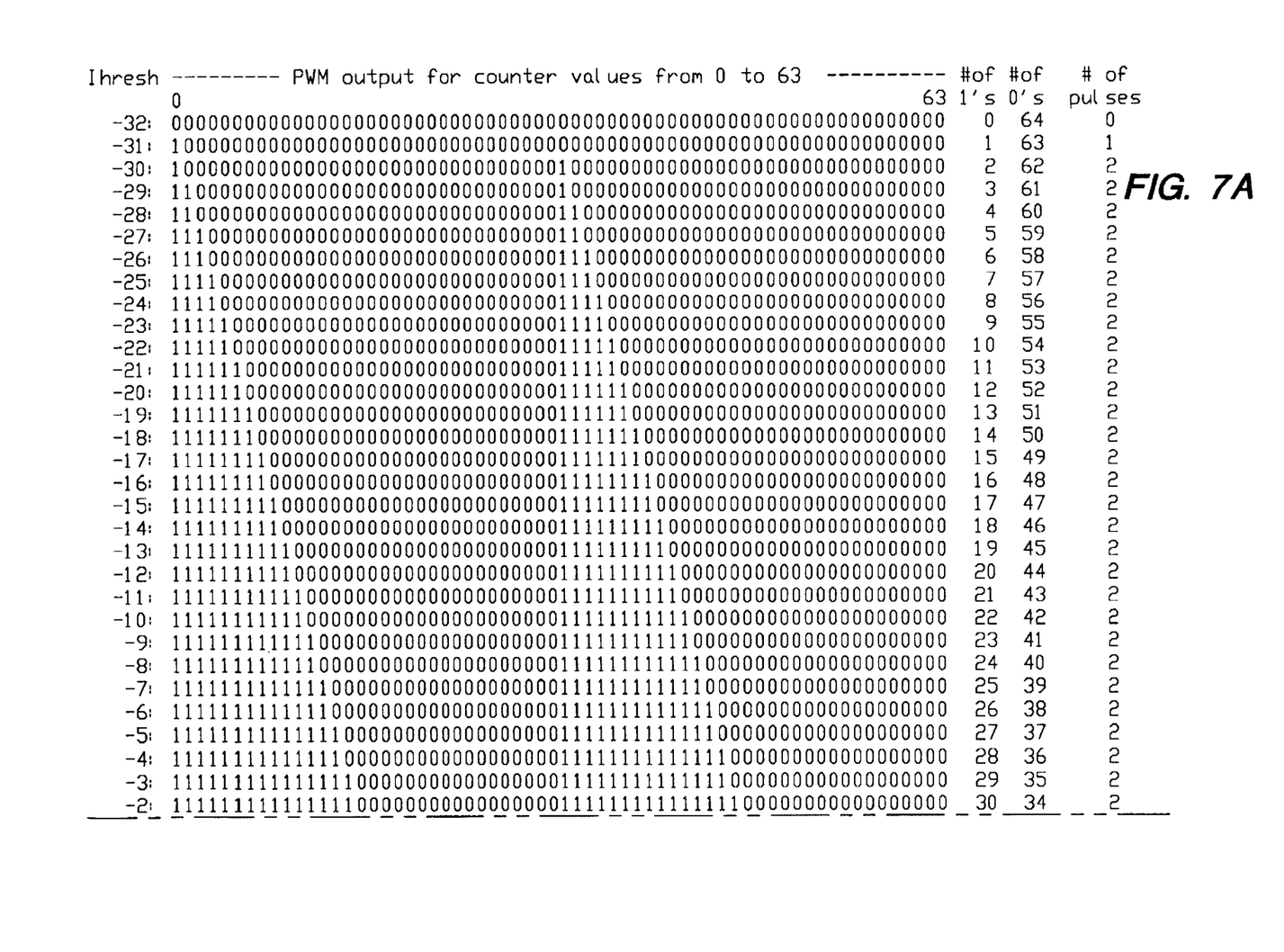
FIG. 7 represents an output spectrum from the comparator of the FIG. 1 circuit resulting from one-bit rotation.
Figure 7B:
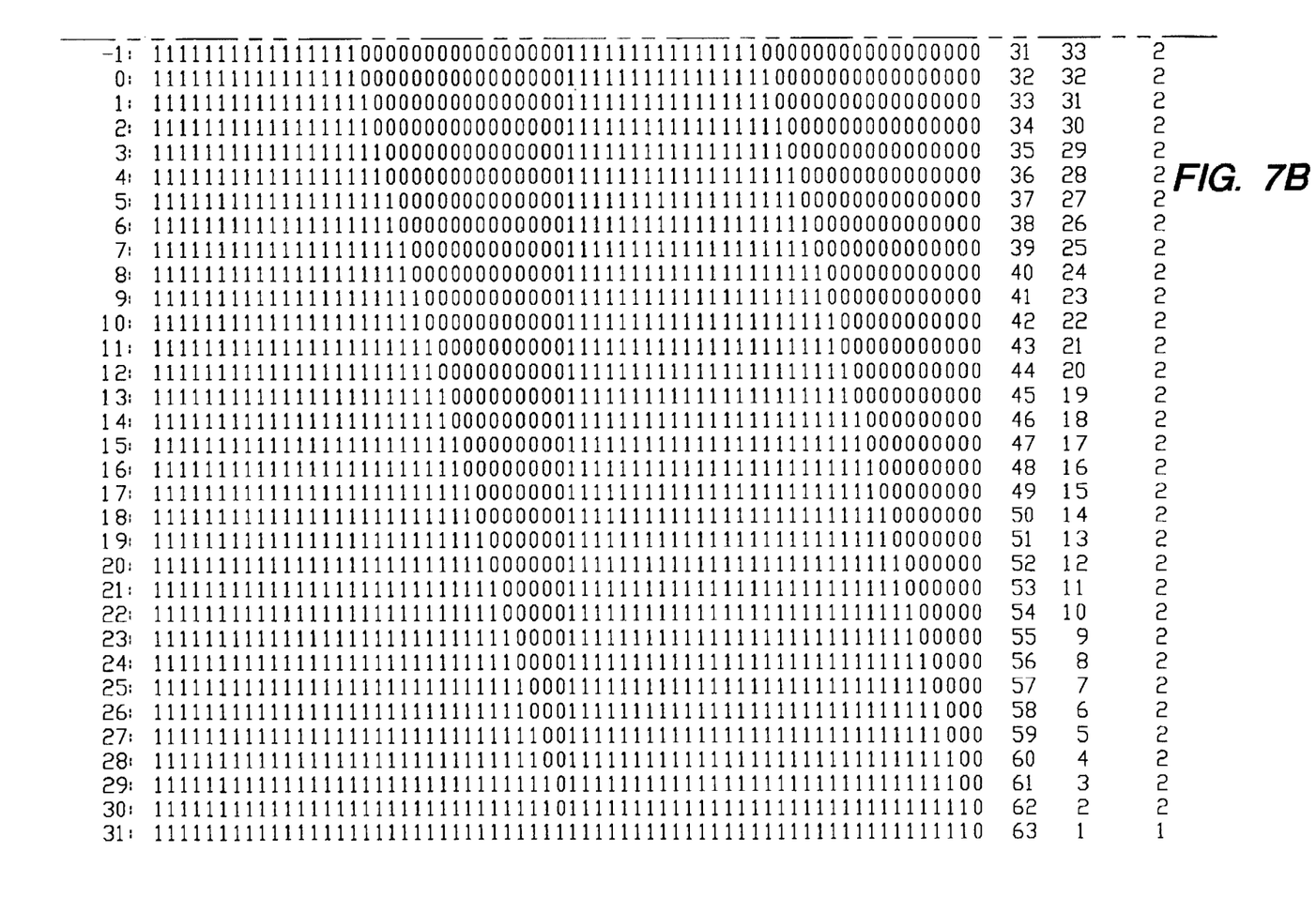
Figure 8A:
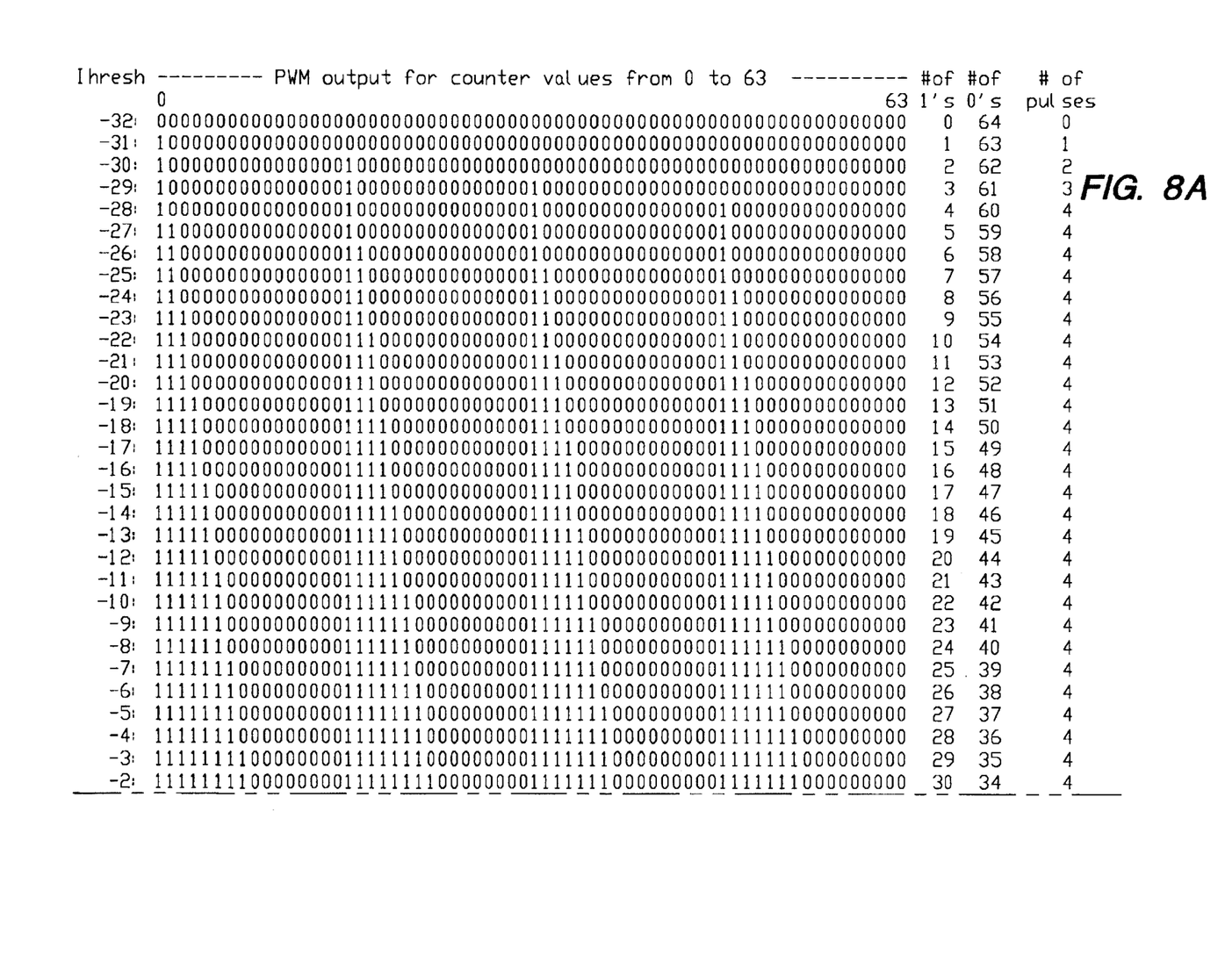
FIG. 8 represents an output spectrum from the comparator of the FIG. 1 circuit resulting from two-bit rotation.
Figure 8B:
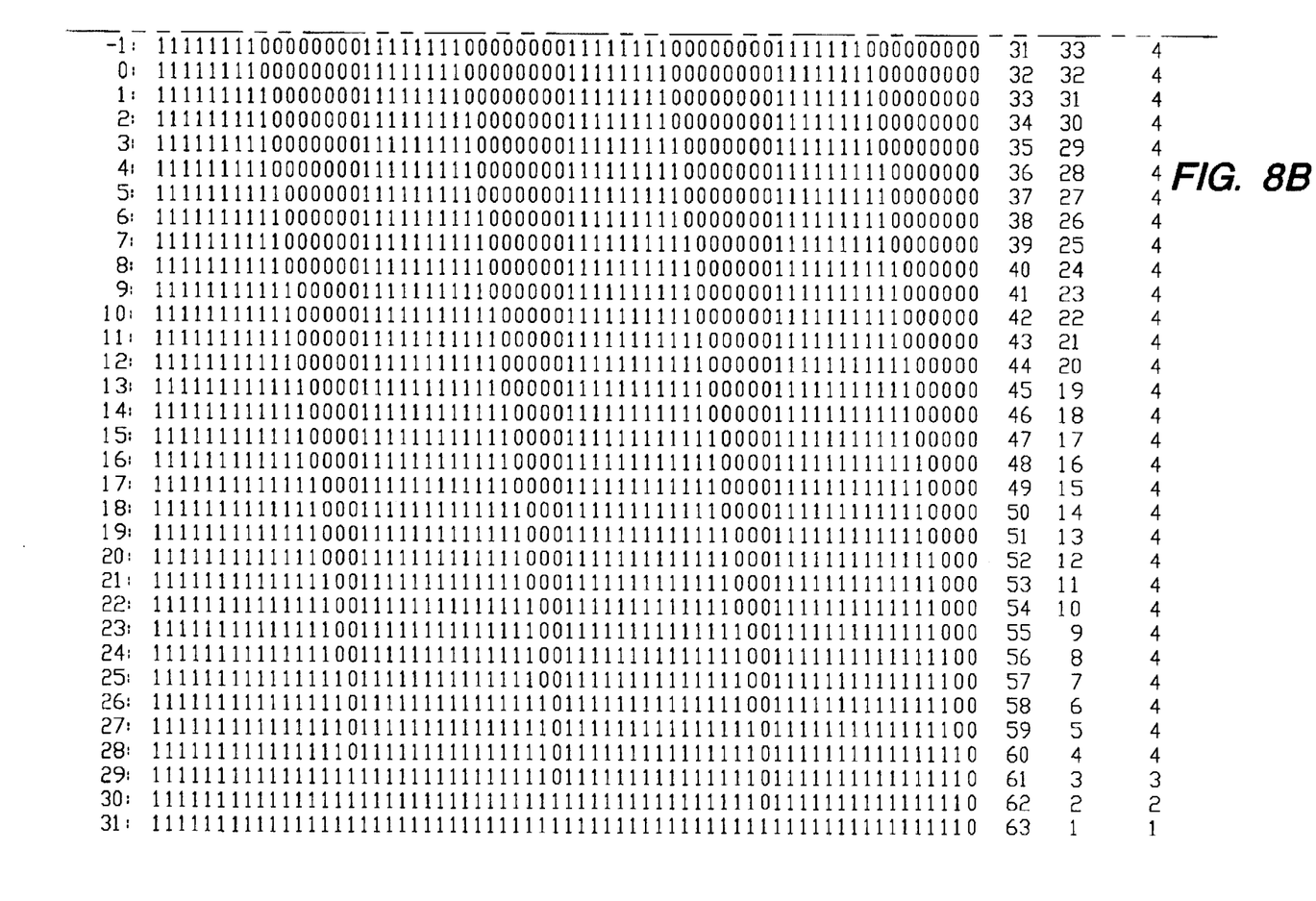
Figure 9A:
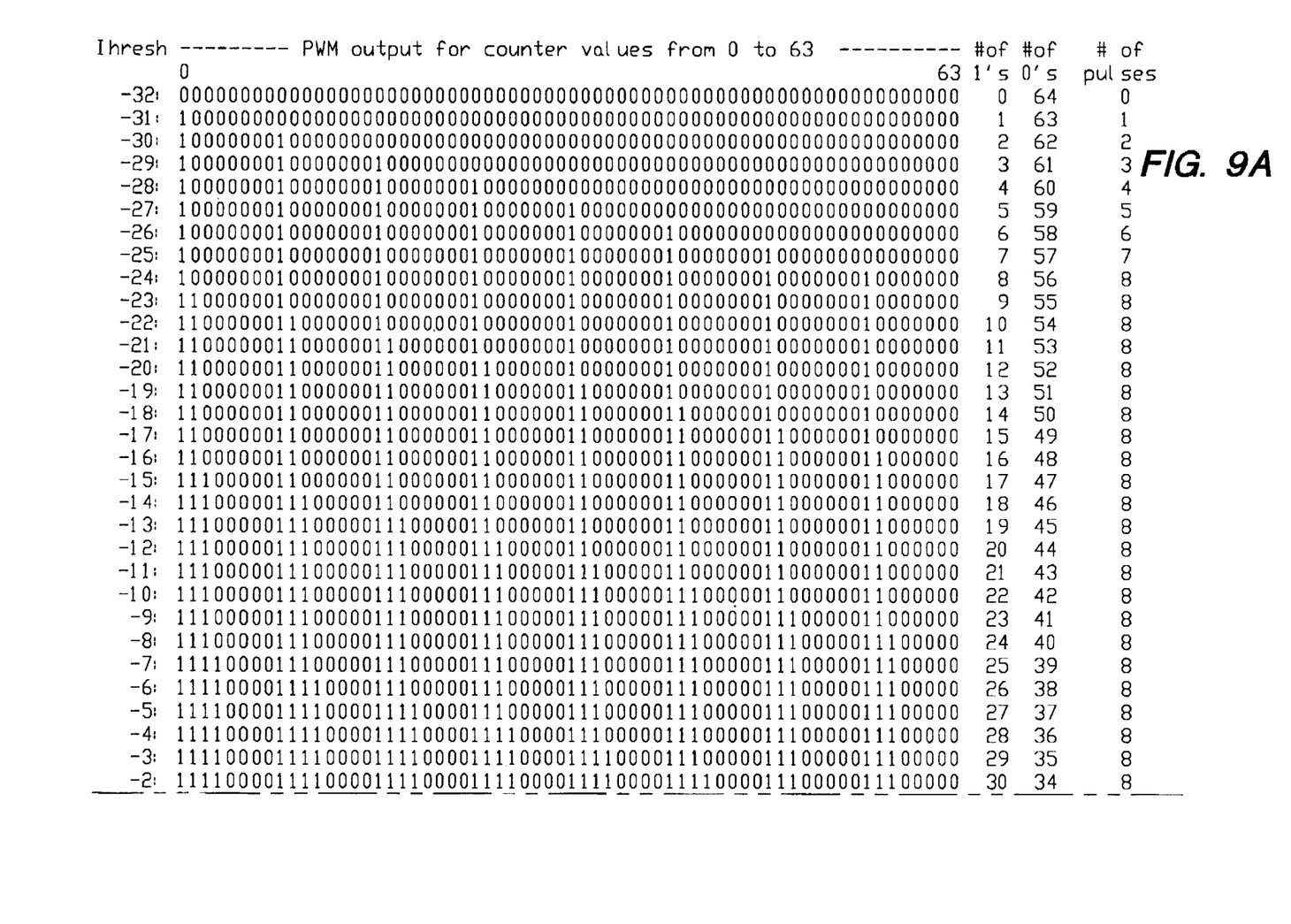
FIG. 9 represents an output spectrum from the comparator of the FIG. 1 circuit resulting from three-bit rotation.
Figure 9B:
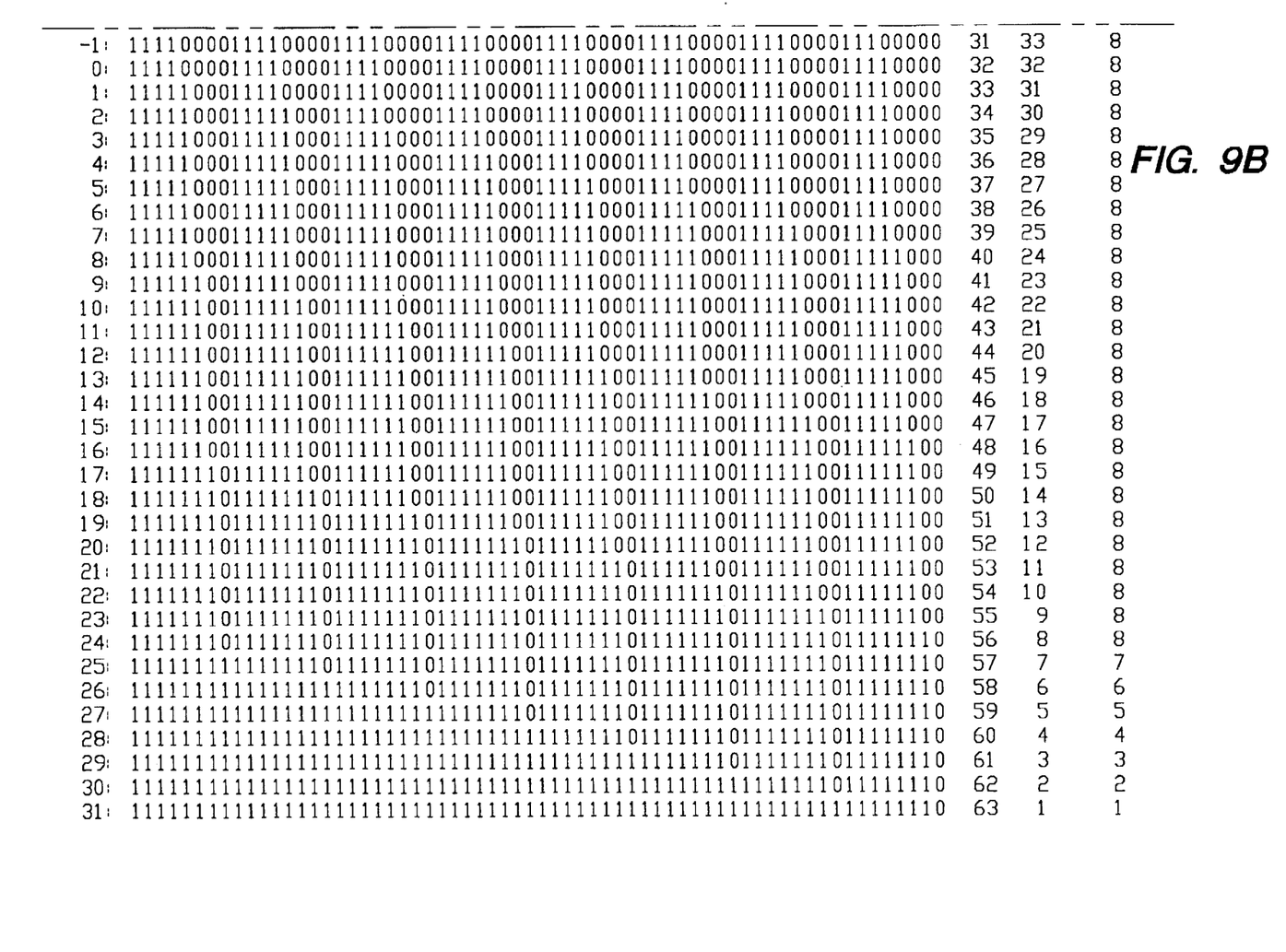

FIGS. 6–9 provide tables of binary patterns put out by the comparator 22 depending upon the bit rotation value R. The left-most column of data in FIGS. 6–9 represents the digital control values (signed values establish current direction and magnitude from a midpoint (absolute count 32) of the available dynamic range). As shown in FIG. 6, when the rotation value R is zero, there is no rotation, and the FIG. 1 PWM DAC functions conventionally. In FIG. 7, with R=1, two pulses (is) having locations and duration as graphed are generated. In FIG. 8, with R=2, four pulses are generated, and in FIG. 9, with R=3, eight pulses per count interval are generated. FIG. 9 also illustrates that at each end of the dynamic range, the number of pulses smoothly decreases in incremental fashion from eight pulses to one or zero pulse. Thus, the present implementation achieves essentially a smooth, glitchless transition to zero or maximum duty cycle.

From the foregoing description it will be appreciated that the number N of bit positions may be a number other than 6, such as 9 or 12. Further, by providing bit rotation, the PWM DAC 10 may be readily realized with an optimized low pass filter 30, having resistance and capacitance elements selected on the basis of clocking rate of the clock 14, and number R of bit positions rotated, to achieve an essentially ripple-free analog signal output with minimized low pass filter for controlling e.g. current passing through the voice coil 34. The counter 12, clock 14, rotator 20, and comparator 22 of the DAC 10 may readily be formed and included as digital logic circuit elements within a large scale digital mode disk drive ASIC. One example of a disk drive ASIC which would be improved by inclusion of a DAC following principles of the present invention is described as drive ASIC 202 shown in FIG. 8 of commonly assigned U.S. Pat. No. 5,255,136 to Machado et al., entitled: "High Capacity Submicro-Winchester Fixed Disk Drive", the disclosure thereof being incorporated herein by reference.

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are by way of illustration only and should not be construed as limiting the scope of the present invention which is more particularly pointed out by the following claims.

What is claimed is:

1. A digital to analog pulse generator for generating width modulated pulses in accordance with a digital control value, comprising:

a clock for generating a clocking signal, a counter responsive to the clocking signal for generating repeating sequences of N-bit counts, each sequence representing a count interval, a bit rotator for receiving the sequences of N-bit counts and for rotating bit position of at least a most significant one of N-bits, a latch for holding the digital control value, a comparator for comparing the digital control value with each one of the rotated N-bit counts to put out the width modulated pulses during the count interval in accordance with the relation $P=2^N$, where $2^N$ is the number of clock cycles in the count interval and wherein a number of pulse-width-modulated pulses output during a count interval is $2^R$, where R is the number of bit positions which are rotated.

2. The digital to analog pulse generator set forth in claim 1 wherein the bit rotator comprises a fixed pattern of rotated bit positions.

3. The digital to analog pulse generator set forth in claim 1 wherein the bit rotator comprises N multiplexers, each having R inputs where R equals the number of bit rotations, the multiplexers being controlled by a common bit rotation control value applied over a common control bus.

4. The digital to analog pulse generator set forth in claim 1 further comprising a low pass filter connected to the comparator to receive, accumulate and filter the width modulated pulses to produce an analog control signal.

5. The digital to analog pulse generator set forth in claim 4 further comprising a driving amplifier connected to drive a voice coil motor of a disk drive in accordance with the analog control signal.

6. The digital to analog pulse generator set forth in claim 1 wherein the counter comprises an N-bit register clocked by the clocking signal, and an N-bit incrementor having an input m connected to an output of the N-bit register and having an output in accordance with $(m+1) \bmod 2^N$.

7. The digital to analog pulse generator set forth in claim 1 wherein N=6.

8. A method for generating width modulated pulses in accordance with a digital control value, comprising the steps of:

generating a clocking signal, generating repeating sequences of N-bit counts by repeatedly counting a sequence marked by the clocking signal, each sequence representing a count interval, rotating bit position of at least a most significant one of N-bits, latching the digital control value, and comparing the digital control value with each one of the rotated N-bit counts to generate the width modulated pulses during the count interval in accordance with the relation $P=2^N$, where $2^N$ is the number of clock cycles in the count interval and wherein a number of pulse-width-modulated pulses output during a count interval is $2^R$, where R is the number of bit positions which are rotated.

* * * * *